(12) United States Patent
Miccoli et al.

(10) Patent No.: US 8,680,653 B2
(45) Date of Patent: Mar. 25, 2014

(54) WAFER AND A METHOD OF DICING A WAFER

(75) Inventors: Giuseppe Miccoli, Dresden (DE);
Bhaskaran Jayachandran, Dresden (DE); Friedrich Steffen, Radeberg (DE);
Alfred Vater, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 891 days.

(21) Appl. No.: 11/938,585

(22) Filed: Nov. 12, 2007

(65) Prior Publication Data

US 2009/0121321 A1    May 14, 2009

(51) Int. Cl.
*H01L 21/78* (2006.01)
(52) U.S. Cl.
USPC ............. 257/618; 257/499; 257/E21.599; 257/E27.009; 257/48; 257/E23.179
(58) Field of Classification Search
USPC .......... 257/618, 48, 499, E23.179, E21.599, 257/E27.009; 438/462
See application file for complete search history.

(56) References Cited

U.S. PATENT DOCUMENTS

| | | | | |
|---|---|---|---|---|
| 5,814,889 A * | 9/1998 | Gaul | | 257/773 |
| 5,850,088 A | 12/1998 | Aono | | |
| 6,075,280 A * | 6/2000 | Yung et al. | | 257/620 |
| 6,500,355 B1 | 12/2002 | Chen | | |
| 7,052,977 B1 | 5/2006 | Yegnashankaran et al. | | |
| 7,129,566 B2 * | 10/2006 | Uehling et al. | | 257/620 |
| 2002/0130394 A1 | 9/2002 | Toyoda | | |
| 2003/0082847 A1* | 5/2003 | Turner et al. | | 438/106 |
| 2003/0102526 A1* | 6/2003 | Dias et al. | | 257/618 |
| 2003/0122220 A1 | 7/2003 | West et al. | | |
| 2004/0217840 A1* | 11/2004 | Lee et al. | | 336/200 |
| 2005/0070068 A1* | 3/2005 | Kobayashi | | 438/401 |
| 2005/0282360 A1* | 12/2005 | Kida et al. | | 438/462 |

OTHER PUBLICATIONS

Sze, S. M., "VLSI Technology," $2^{nd}$ Edition, 1988, 5 pages, McGraw-Hill, USA.

* cited by examiner

*Primary Examiner* — David Vu
*Assistant Examiner* — Jonathan Han
(74) *Attorney, Agent, or Firm* — Slater & Matsil, L.L.P.

(57) ABSTRACT

A wafer includes a plurality of chips, each of the chips being spaced from each other by kerf-line regions including a reduced width.

18 Claims, 16 Drawing Sheets

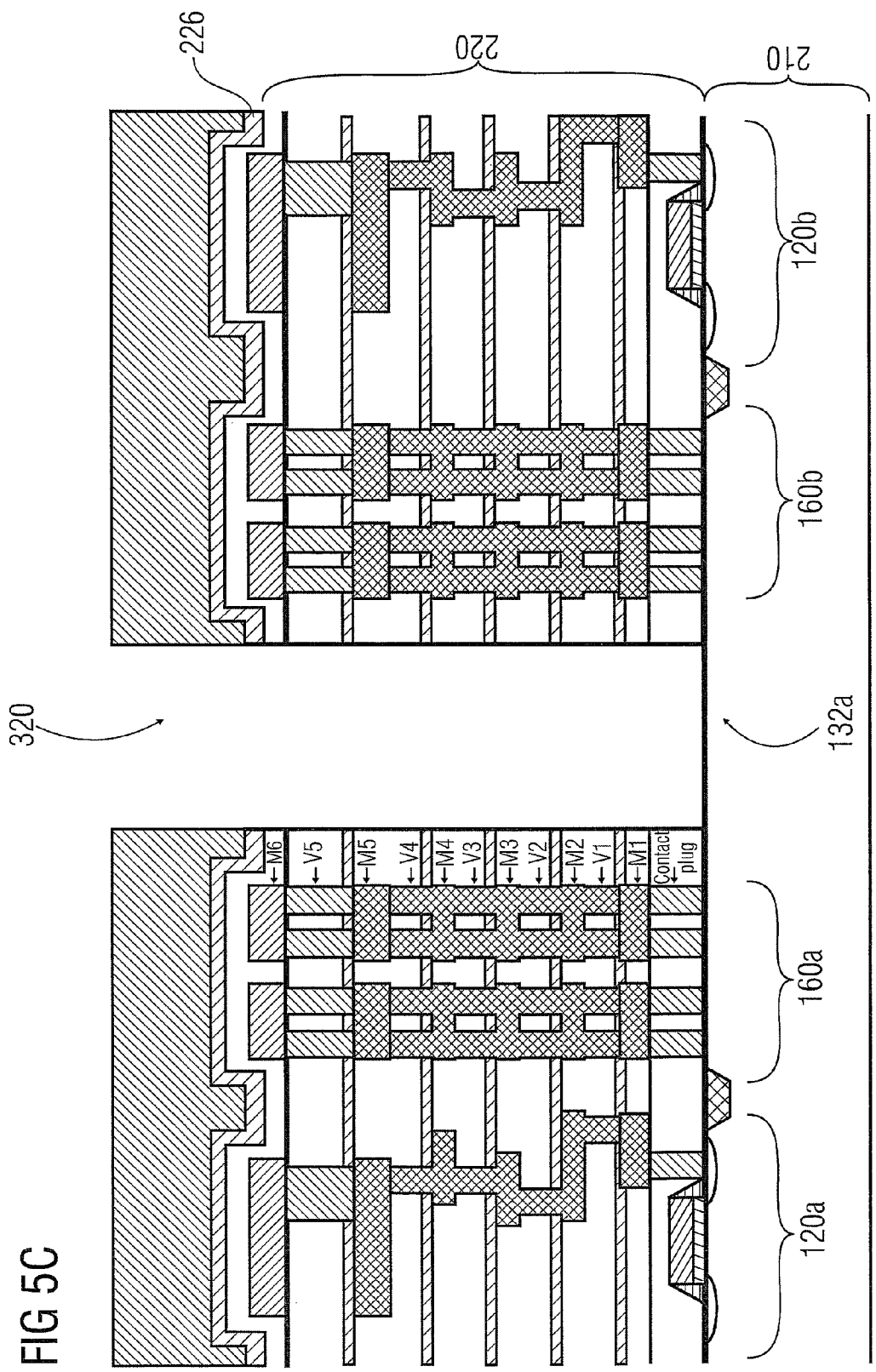

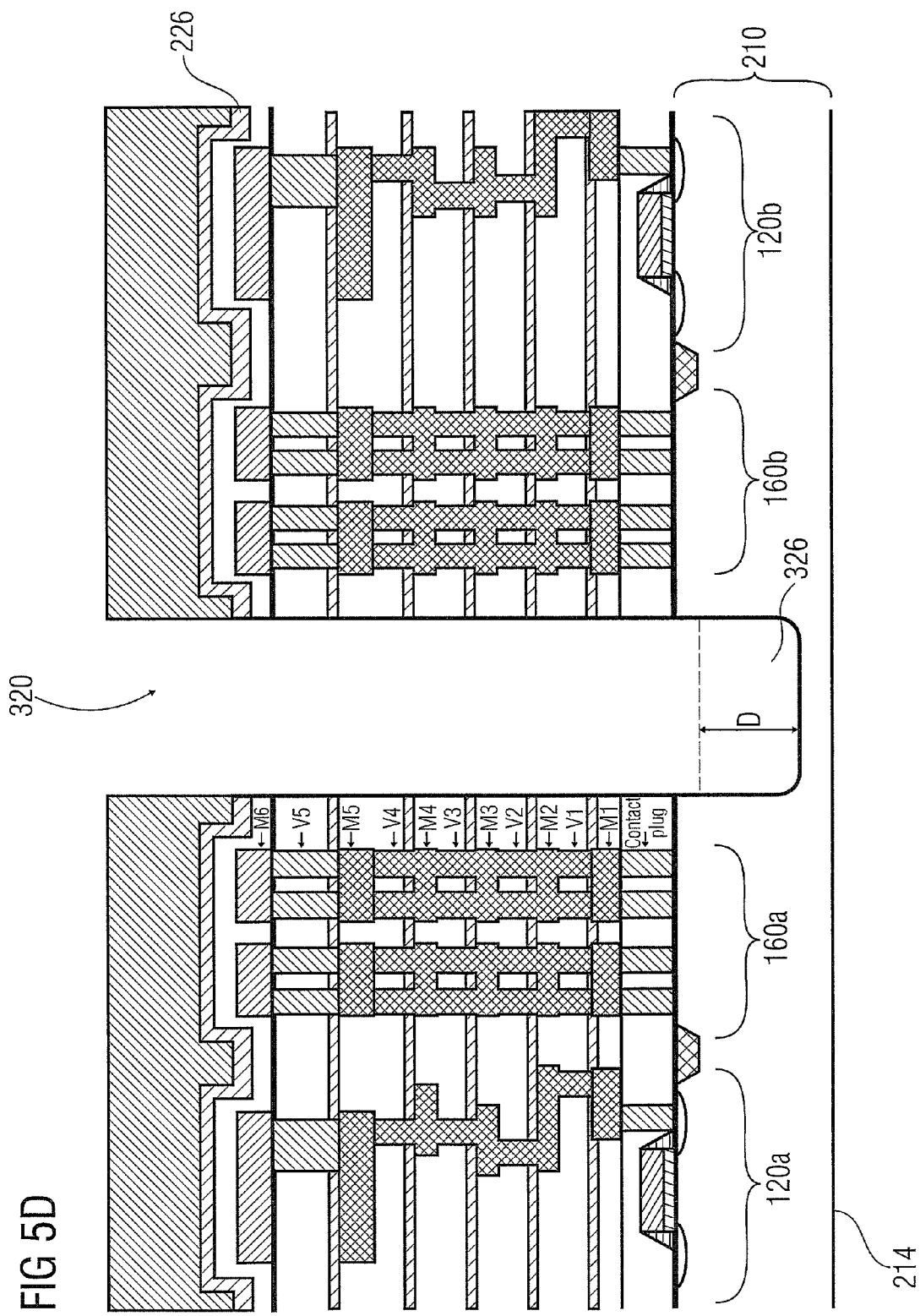

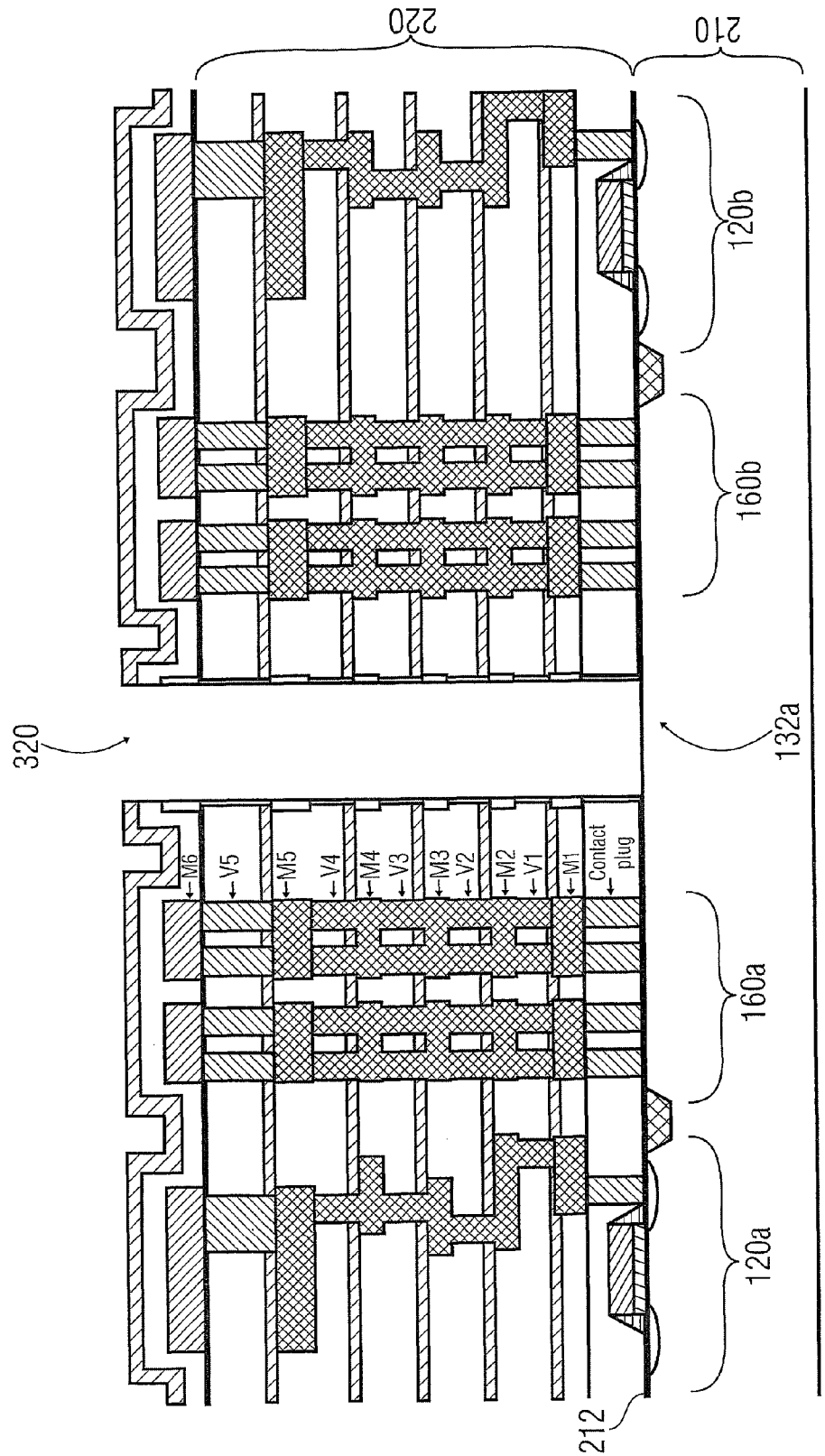

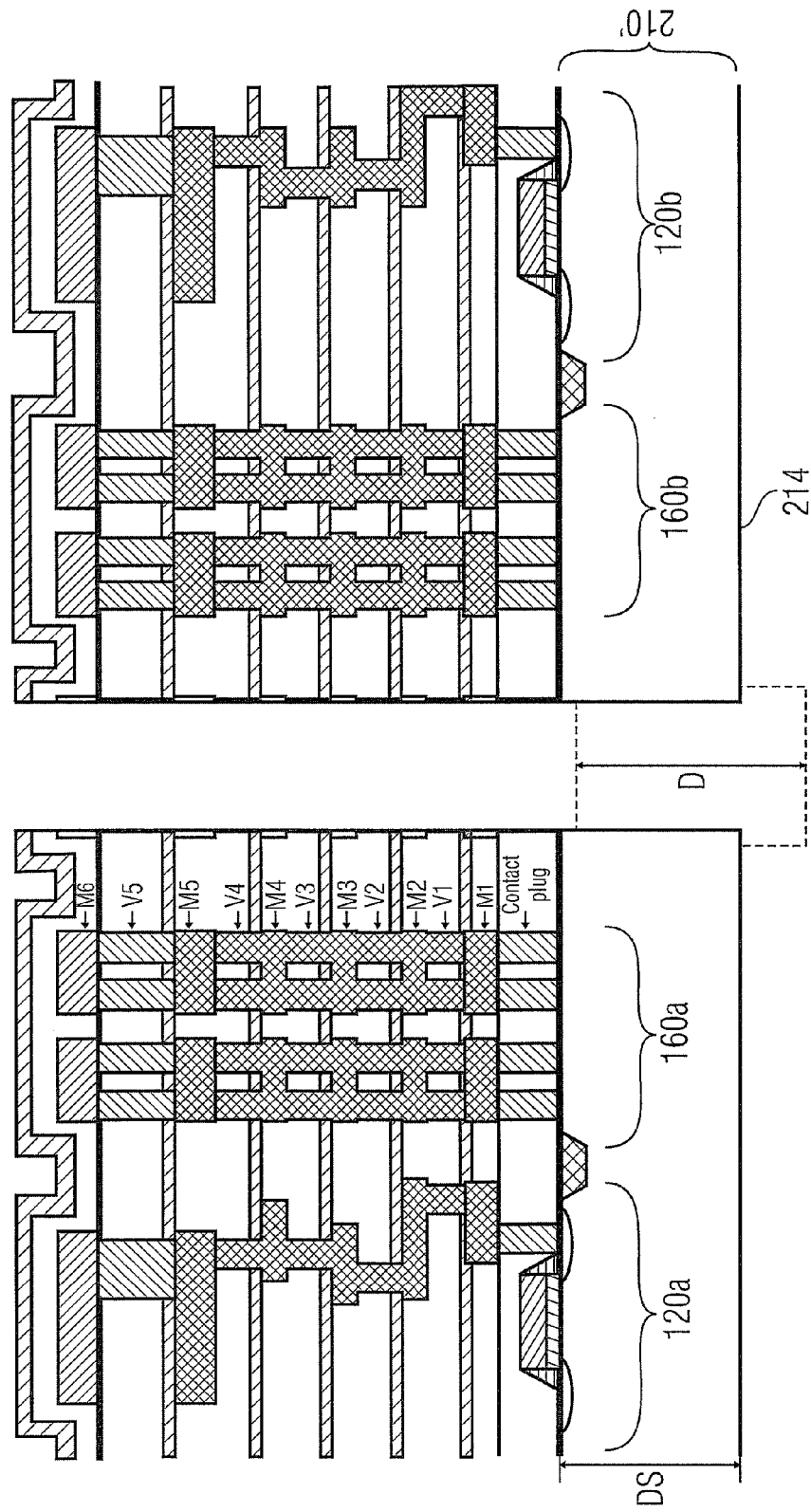

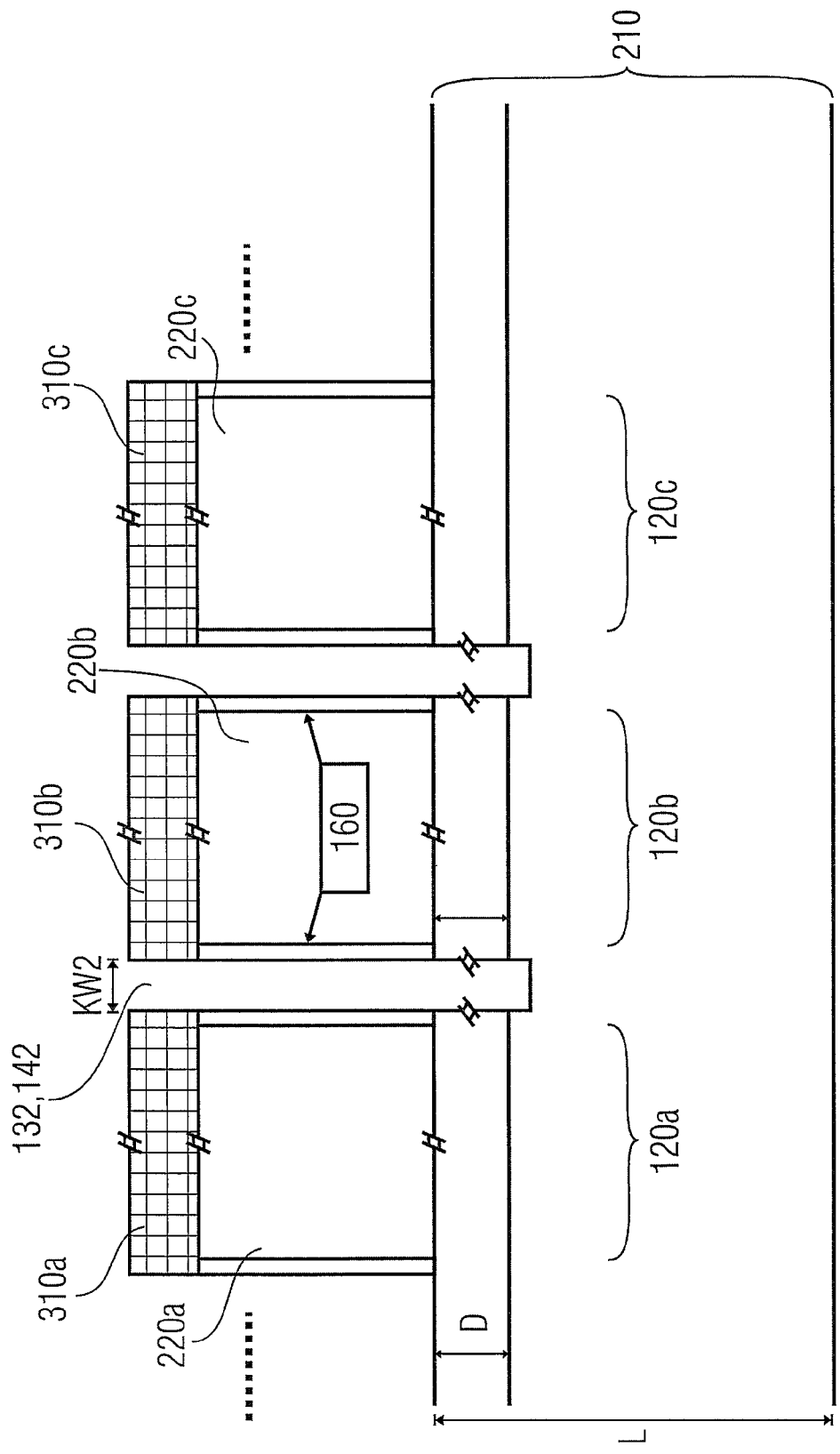

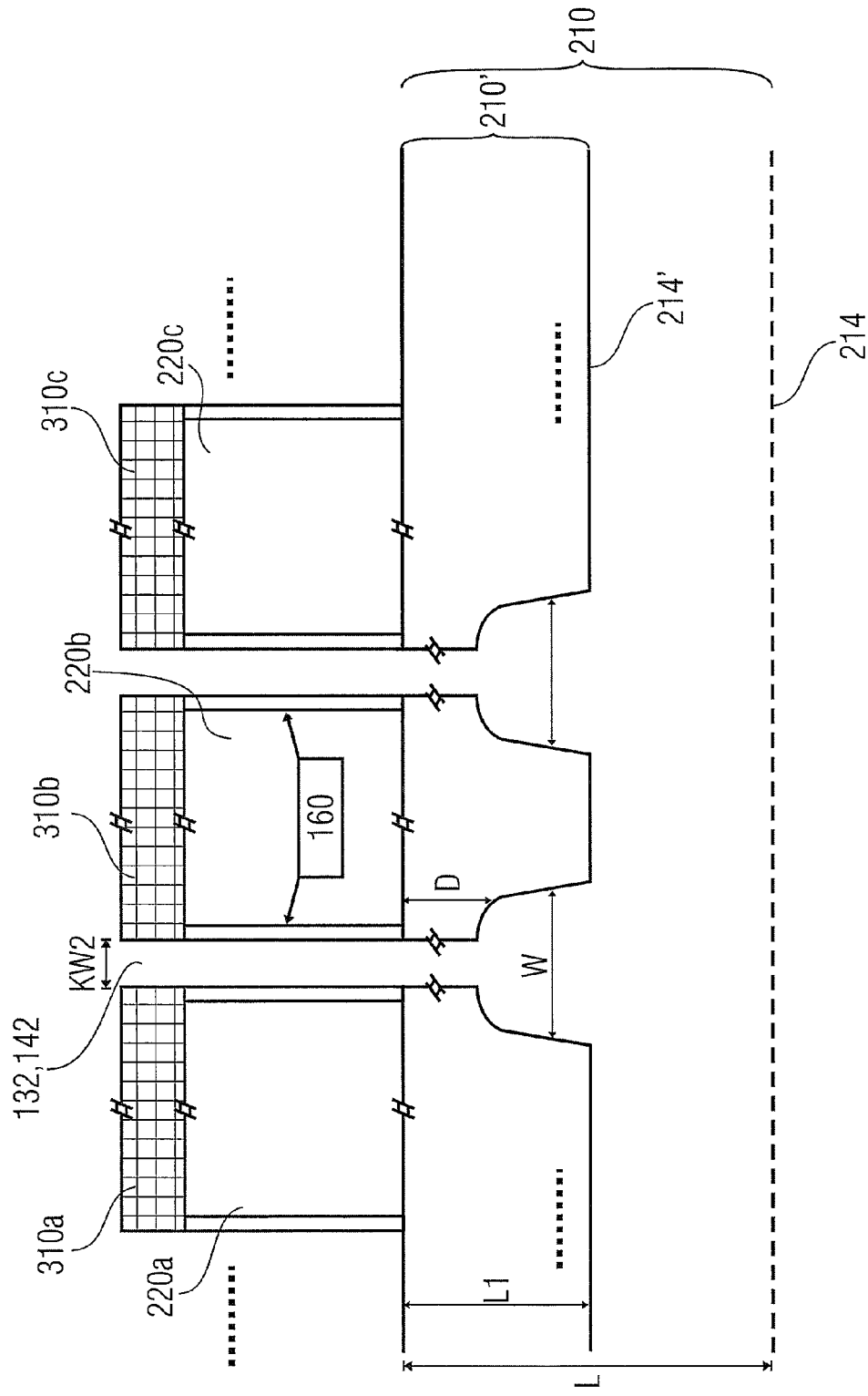

WAFER AND A METHOD OF DICING A WAFER

BACKGROUND

Embodiments of the present invention relate to a wafer and a method of dicing a wafer, and in particular, to a method that drastically reduces a scribe-line width of silicon semiconductor wafers. This is especially needed in modern chip production in order to maximize the silicon utilization of semiconductor wafers so that the wafer can accommodate a maximum possible number of chips. This is especially relevant for flash or smart power products, logic products, memory products, etc.

BRIEF DESCRIPTION OF THE DRAWINGS

The features of the embodiments of the invention will be more readily appreciated and better understood by reference to the following detailed description, which should be considered with reference to the accompanying drawings, in which:

FIGS. 5*a* to 5*e* show a first process flow for dicing a wafer according to an embodiment;

FIGS. 6*a* to 6*e* show a further process flow for dicing a wafer according to a further embodiment;

FIG. 7 shows a grinding process to separate each chip in case of very thin chips; and FIG. 8 shows a backside laser cut to separate each chip.

Figure 1:
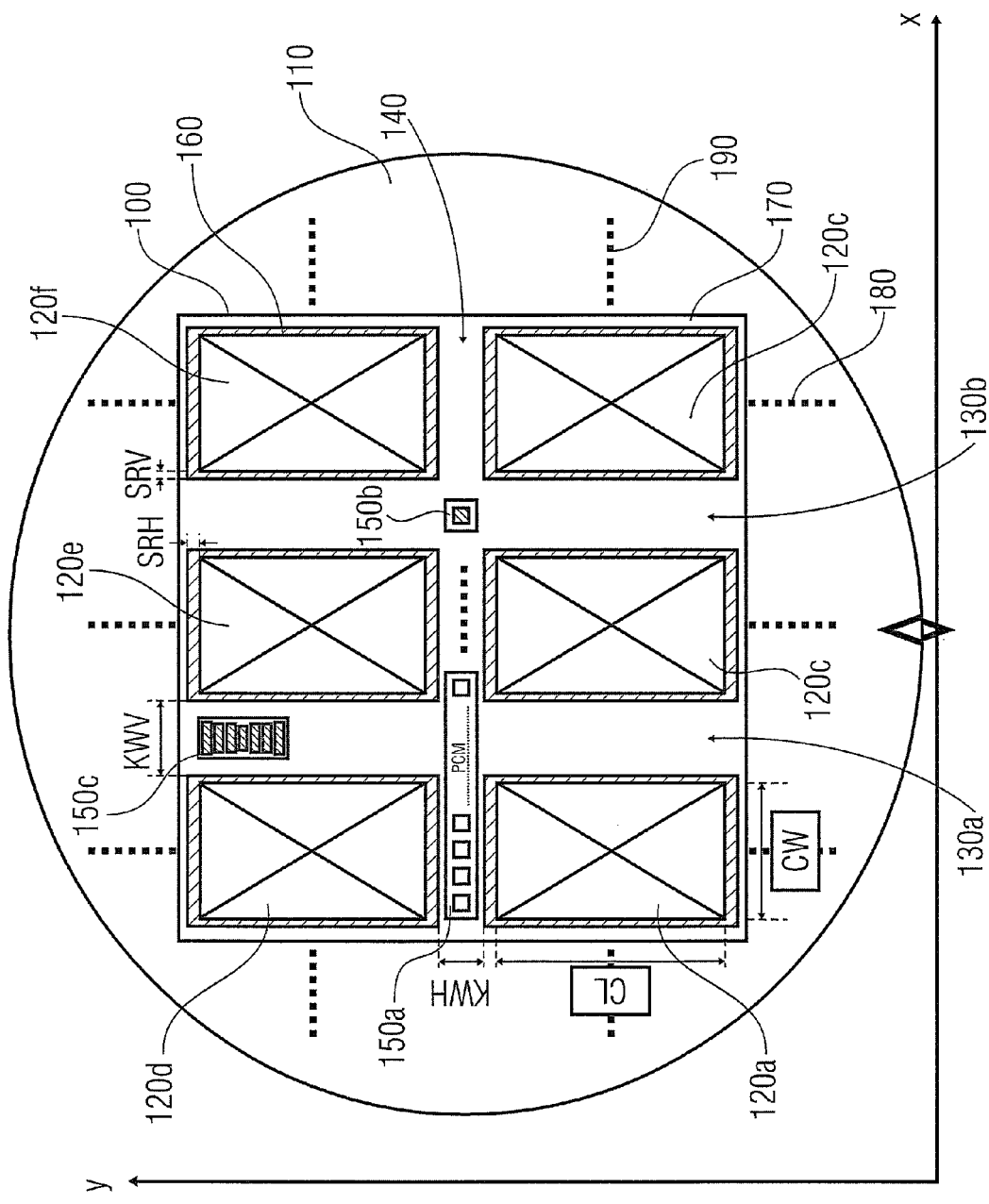
FIG. 1 shows a wafer with chips with wide vertical and horizontal scribe-lines.

Before embodiments of the present invention are explained in more detail below with reference to the drawings, it is to be noted that equal elements, or those operating in an equal way are provided with same or similar reference numerals in the figures, and that a repeated description of these elements is omitted.

DETAILED DESCRIPTION OF ILLUSTRATIVE EMBODIMENTS

Normally, when semiconductor devices (chips) are manufactured on wafers (e.g., silicon wafers of semiconductor wafers), a dicing street is formed in order to saw the semiconductor wafer during final assembly and packaging/encapsulation phases. Such a dicing street, which surrounds each chip on the wafer on its sides (for example, four sides if the chip is rectangular) comprises a width which varies from technology to technology. The dicing street is also called scribe-line or kerf. A narrow available kerf or scribe-line with conventional technology comprises, for example, a width of about 62 µm.

The scribe-line or the kerf defines a minimum distance between chips, which is required by the used dicing technology and accommodates, in addition, a number of structures used for controlling the manufacturing operations. Such structures are, for example, typical process control monitor test structures (PCM), photolithographic alignment structures, wafer level reliability test circuits, film thickness and critical dimension (CD) measurement structures, etc. When the dicing operation is performed, the wafer estate (for example, the silicon) of the scribe-line is wasted and mentioned test structures are destroyed.

The width of the scribe-line or kerf is determined by two factors:
(a) the width of the dicing blade; and
(b) the width of the test and measurement structures.

The aforementioned test and measurement structures are no longer needed after the dicing operation.

Since these two factors imply a minimal width for a conventional kerf, the smaller the area of the chips, the higher the percentage of wasted silicon or wasted wafer estate in the scribe-line. Therefore, any method to reduce the width of the scribe-line will increase the possible number of chips-per-wafer (CPW). As a consequence, the chip costs are reduced.

A conventional approach to achieve a reduction of the scribe-line width employ a repetitive plasma dry etch approach, which however fails to be applicable to copper based, dual-damascene, metallization schemes, since copper cannot be dry etched by plasma. Moreover, the conventional approach uses numerous and long over-etch times, and the time thereby required leads to a remarkably reduced etch tool throughput. There is, however, no solution available to drastically reduce the scribe-line width for the case of complex integrated circuits.

Embodiments of the present invention provide a wafer comprising a plurality of chips integrally connected to each other by kerf-line regions, the kerf-line regions separating adjacent chips and at least one kerf-line region comprises a width of less than 10 µm. In further embodiments kerf-line regions comprise a width of, for example, less than 5 µm or approximately 2 µm.

With this reduction of the kerf width (for example, to about 2 µm) the test and monitor (or measurement) structures cannot be arranged along a scribe-line or kerf and it is needed to re-arrange the test and monitor structures. If the width of the test and monitor structures could be reduced to such a minimal value (of about 2 µm) the test and monitor structure could remain in the kerf. There is however, no solution available for this.

Since the test and monitor structures are indispensable for the correct manufacturing operation, embodiments of the present invention propose the following alternatives:

(1) reduce the kerf width to, for example, 2 µm only in one direction, a vertical or horizontal direction, and keeping the width of kerf-lines of the other direction unchanged. In this case, the needed test and measurement structures can be placed in at least one of the kerf width with unchanged width, which are also denoted by wide kerf-lines.

(2) reduce the kerf width to the exemplary 2 µm in one direction, wherein in this one direction, for example, one instance of the scribe-line is kept at the original width of, for example, approximately 60 µm. The width of the scribe-line in the other direction can be kept unchanged. Hence, along the one direction (horizontal or vertical) one wide kerf-line is formed, whereas the remaining kerf-lines are small.

(3) reduce the kerf width in both directions to about 2 µm and lump together the needed test and monitor structures into a space of one or more chips in the floor plan of the photolithographic reticle.

The kerf width of about 2 µm is chosen here only as an example, and narrower widths are also possible and with the vertical and horizontal direction it is referred to both lateral directions of the wafer, e.g., an x-direction as horizontal and a y-direction as vertical direction if an (x,y)-coordinate system is used.

Therefore, embodiments of the present invention comprise small kerf-lines and wide kerf-lines. The wide kerf-lines comprise the conventional width needed to accommodate the test and monitor structures (for example, more than about 40 µm) and the small kerf-lines comprise the reduced width to about 2 µm, for example. The test and monitor structures can thus be arranged along one or more wide kerf-lines, wherein the wide kerf-lines can be formed along horizontal or vertical directions. In further embodiments only a single wide kerf-line is formed in order to accommodate the test and monitor structures. In further embodiments, the test and monitor structures are arranged in a separate region, which can, for example, be a site, where normally a chip is formed, which is sacrificed in order to provide room for the test and monitor structures.

In yet another embodiment, the kerf-line regions comprise a layer stack comprising, e.g., a plurality of metal layers connected by via layers in order to provide a metallic structure between adjacent chips.

Embodiments of the present invention furthermore comprise a method of dicing the wafer, wherein the wafer comprises, as mentioned before, a substrate with a first surface and a layer stack formed on the surface. Moreover, a plurality of circuits is being formed within the wafer and the plurality of circuits is being laterally distributed over the wafer with kerf-line regions extending between the plurality of circuits. Within the kerf-line regions, the layer stack can be continuously formed of an isolation material. The method comprises a step of selectively etching the isolation material, a step of further etching along the kerf-line regions to remove a part of the substrate and a step of separating the plurality of chips. The continuously formed isolation material is formed at one hand along the circumference of the circuit or chip and hence forms a closed loop around the circuit. On the other hand, the isolation material is also continuously formed across the layer stack from the first surface of the substrate towards a surface of the wafer.

In further embodiments the kerf-line regions comprise the aforementioned layer stack with conducting material (for example, continuously formed metallic layers), which can be formed again as a closed loop around the circuit or chip (formed continuously along a circumference) as well as continuously along the direction perpendicular to the lateral extension of the wafer. Hence, the method comprises a further step of etching the layer stack of conducting materials (or metals), which at the same time can also remove a photoresist used as a mask. An additional etching step removes again a part of the substrate and finally a step of separating of the plurality of chips is performed.

Embodiments of the present invention can therefore be characterized by the fact that a single additional lithography masking layer is adapted. This additional photolithography masking layer is for simplicity also named KE mask (KE=Kerf Etch). The separation of the dies can therefore be conducted, for example, by following one of two options, wherein option A comprises the steps:

(1A) An oxide plasma dry etch is conducted through a photoresist layer patterned with the KE mask that etches away the stack of isolating materials that had been deposited, for example, in several previous steps on the upper surface (active area) of the silicon wafer during the manufacturing process. Examples for this isolating material comprise a passivation layer or oxide layers used in MOS-technology (MOS=metal-oxide-silicon). This oxide plasma dry etch stops on the surface of the silicon wafer and is developed to have a particularly fast etch rate.

(2A) A dry plasma etch of the single crystal silicon wafer (substrate) is then performed, which etches a slit around the integrated circuit chip in the silicon. The depth of the slit being dependent on the final intended thickness of the chip. For this etching step an anisotropic etching can be used so that neighboring circuits in the wafer remain intact.

(3A) A wafer backside grind is conducted that reduces the thickness of the (silicon) wafer to the depth of the slit. At such a moment, each chip is separated from each other and ready for singulation. The backside grind can also be combined with a backside laser cut, especially for the case where the slit from the second step is not deep enough for an intended thickness of the wafer or the silicon substrate.

In an option B, a unique utilization of the wet etch of metals is executed in the first of the two parts of cutting between chips. In detail, the option B comprises the following steps:

(1B) During the manufacturing process of the wafer, a stack of metal (or other conducting materials) layers is constructed, wherein the stack of metal layers is shaped as lines around the chip edges and connected to each other by appropriate via-contacts. The via-contacts can also be shaped as slits. As a result, a continuous layer stack of metals that is as wide as the KE mask opening or as wide as the kerf-line can be constructed with the resulting stack-of-metal lines being aligned to the KE mask. An oxide plasma etch removes the last protective oxide or nitride layer (e.g., a passivation layer) and exposes the top metal layer. A wet etch based on, for example, hydrogen peroxide, sulfuric acid and water (called Piranha) can selectively etch away the photoresist (comprising, e.g., an organic material) as well as the stack of metal layers. Such metals can be aluminum, copper or tungsten. Finally, a slit as wide as the KE mask opening will result and the slit separates the chips from above the wafer (silicon) surface.

(2B) Performing the same steps as stated under option A.

(3B) Performing the same steps as stated under option A.

Since no critical dimensional control is required to perform the needed manufacturing operations, the benefit of both options described before, comprises the fact that the necessary tools do not need to be particularly advanced, at least with respect to the current technological status. The tools could be fully depreciated, therefore, minimizing the manufacturing costs of the operations. Additionally, the classical dicing tools based on high-speed rotating blades are no longer required.

Thus, embodiments of the present invention apply established semiconductor manufacturing technologies to separate silicon devices or other devices manufactured on a silicon wafer by minimizing the space lost between dies.

Embodiments are especially advantageous, since relatively low costs of the processes allow the economical implementation of a very narrow scribe-line or kerf, which turns out to yield higher (silicon) estate utilization. Hence, embodiments yield a maximization of utilization of wafer material, comprising, for example, silicon, by means of a drastic reduction of the width of the scribe-line (kerf-line), which separates adjacent integrated circuits (chips).

Embodiments are moreover advantageous for products whose area is less than 3×3 mm$^2$ and since mechanically dicing is eliminated or replaced by embodiments of the present invention, edges of the chips comprise an improved surface structure due to the plasma or wet etching to singulate the chips without damages caused by the mechanical dicing methods.

FIG. 1 shows a schematic of an array of integrated circuits (chips) 120a-120f (collectively "120") on a semiconductor wafer 110 of a conventional or current classical approach for allocating integrated circuits 120, which are separated by vertical scribe-lines (or kerf-lines) 130a-130b (collectively "130") and a horizontal scribe-line (or kerf-line) 140 hosting the test and monitor (or measurement) structures 150a-150c

(collectively "150"). An (x,y)-coordinate system is used, wherein the x-direction denotes the horizontal and the y-direction the vertical direction. The array of integrated circuits 120a-120f is not drawn to scale. It is repeatedly printed on the wafer 110 by lithographic processes a given number of n times and, therefore, accommodating a larger matrix of chips on the wafer 110.

For a conventional wafer 110, the vertical and horizontal scribe-lines 130a-130b, 140 comprise a width of, for example, more than about 50 μm or of a nominal about 62 μm. FIG. 1 shows one horizontal kerf-line 140 and two vertical kerf-lines 130a, 130b. The horizontal kerf-line 140 exemplarily accommodates a first and second test and monitor structure 150a and 150b comprising, for example, the process control monitor test structure, while a first one of the vertical kerf-lines 130b comprises a second test and monitor structure 150b and a second one of the vertical scribe-lines 130a comprises a third test and monitor structure 150c. Of course, this is just an example. Other types of structures within the kerf-lines and another number of structures arranged therein may be used as well. Hence, this conventional wafer 110 comprises vertical/horizontal kerf lines with macros (scribe-line). The vertical scribe-lines 130a-130b comprise a width KWV and the horizontal scribe-line 140 comprises a width KWH. The chips 120a-120f are surrounded by a seal ring 160, wherein the seal ring 160 comprises a vertical width SRV and a horizontal width SRH. Similarly, the chips 120a-120f comprise a vertical width CW and a horizontal width or length CL.

FIG. 1 therefore shows the lithographic reticle field with coordinates x and y, wherein the x coordinate is along the horizontal direction and the y coordinate is along the vertical direction. Moreover, in FIG. 1 only a part of chips 120, which are inside a region 170, are shown, a first to sixth chip 120a to 120f. The center of the chips 120a-120f are aligned at the crossing points of the vertical alignment line 180 and the horizontal alignment lines 190. However, the arrangement shown serves for illustrating purposes only. Other regular or irregular arrangements and shapes of the chips such as hexagonal ones and other extensions of the kerf-lines may be used as well. Moreover, the number of chips is also variable and may be below or above six. This is also true for the following FIGS. 2 and 3 also showing respective top views.

Figure 2:
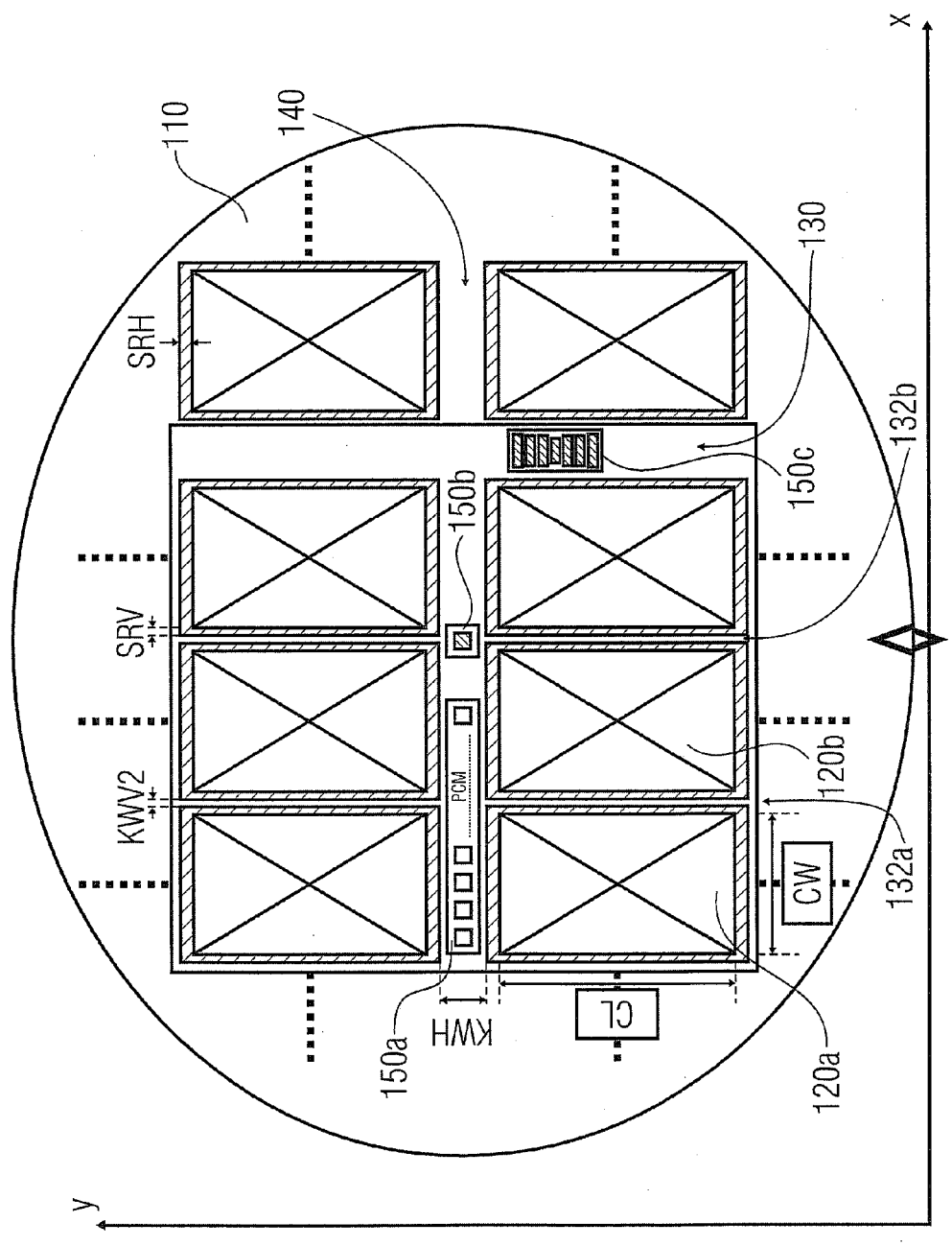
FIG. 2 shows a wafer with chips with asymmetric scribe-lines according to an embodiment of the present invention.

FIG. 2 shows a wafer 110 with chips 120a, 120b, or a schematic of an array of integrated circuits 120 on a semiconductor wafer 110, arranged according to an embodiment of the present invention. An arrangement of asymmetric vertical scribe-lines 130 and horizontal scribe-lines 140 is used. In detail, in this embodiment an asymmetric reduction of the wide vertical scribe-lines 130 to small scribe-lines 132a, 132b of a width KWV2, for example, about 2 μm, is performed, whereas the horizontal scribe-line 140 is unchanged to the conventional width of KWH. In addition in this embodiment one instance of the vertical scribe-line 130 is kept at the original width KWV within the lithographic reticle. In further embodiments also more vertical scribe-lines 130 can be kept at the original width KWV.

The test and monitor structures 150a-150c are exemplarily shown to be arranged along the horizontal scribe-line 140 and the vertical scribe-line 130, wherein the first test and monitor structure 150a and the second test and monitor structure 150b are exemplarily shown to be arranged along the horizontal scribe-line 140 and the third test and monitor structure 150c are exemplarily shown to be arranged along the vertical scribe-line 130. Naturally, this is just an example, and other types of structures within the kerf-lines and another number of structures arranged therein may be used as well. In further embodiments, additional horizontal scribe-lines 142 (FIG. 3) with small widths are present as well as additional horizontal scribe-lines 140 with the conventional width KWH being present and the test and monitor structures 150 being distributed over wide horizontal scribe-lines 140. Similarly, additional wide vertical scribe-lines 130 can be arranged so that the test and monitor structure 150, or part of them, can be distributed over different wide vertical scribe-lines 130.

The chips 120a, 120b comprise the same geometry as before, a length CL and width CW as well, as the same sealing rings 160. The chips 120a, 120b being only shifted along the wafer surface, so that within the (x,y)-plane to narrow wide scribe-lines (horizontal scribe-lines 140 and/or vertical scribe-lines 130).

Figure 3:
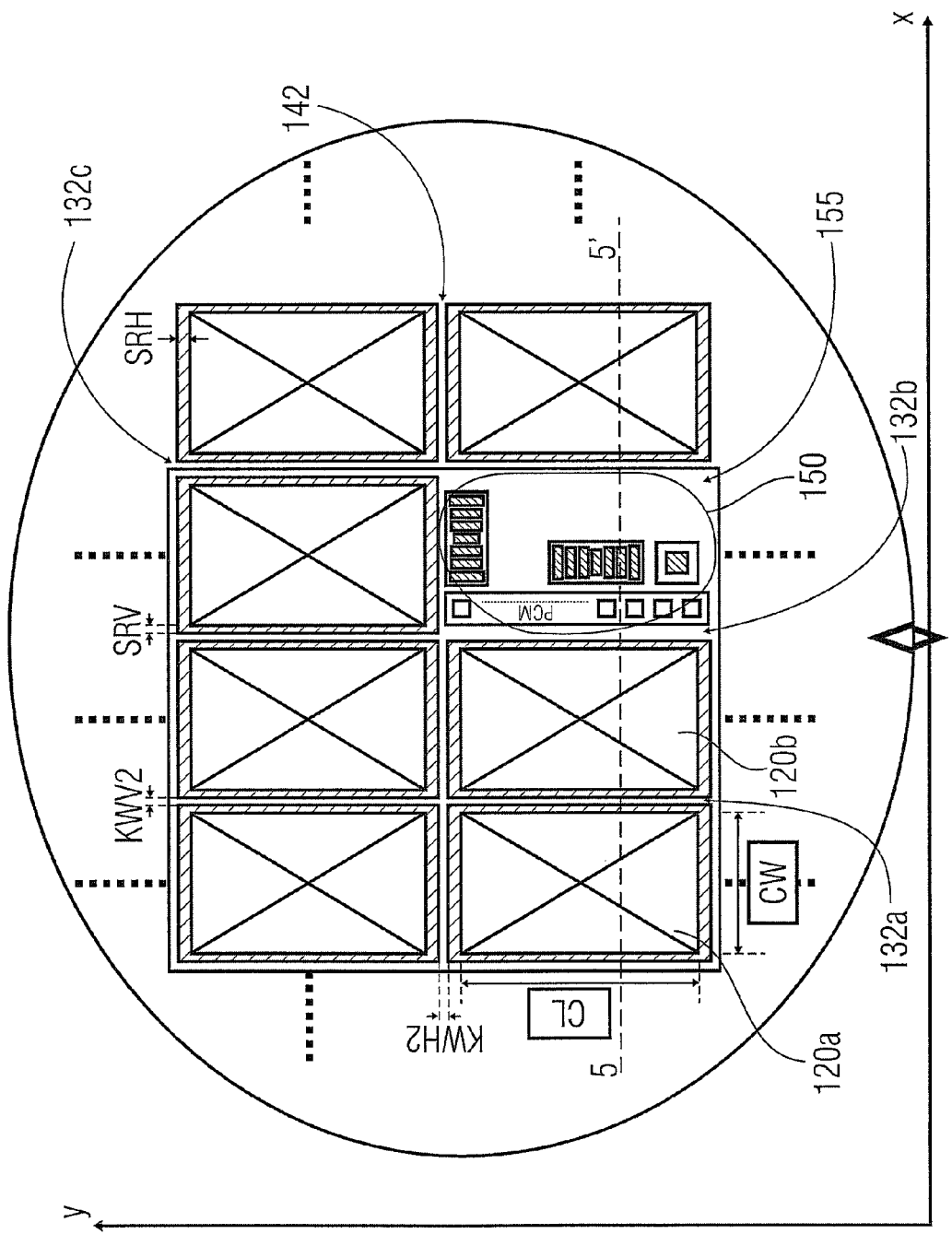
FIG. 3 shows a wafer with chips with small vertical and horizontal scribe-lines according to another embodiment.

FIG. 3 shows a schematic of an array of integrated circuits or chips 120a, 120b on a semiconductor wafer 110, wherein both of the wide horizontal scribe-lines 140 and the wide vertical scribe-lines 130 are reduced to the exemplary widths of about 2 μm. The needed test and measurement structures 150 can be lumped into the region 155 and replace one (or more) die(s). As before, the chips 120a, 120b are only shifted in FIG. 3 to decrease the width of the wide horizontal scribe-lines 140 from the value KWH to the value KWH2 with the exemplary value of about 2 μm to achieve small horizontal scribe-lines 142. In the same way the width KWV of the wide vertical scribe-lines 130 is reduced so that small vertical scribe-lines 132 with a width of KWV2 appear. The width KWV2 of the small vertical scribe-lines 132 and the width KWH2 of the small horizontal scribe-lines 142 can, for example, comprise about 2 μm instead of the exemplary value of about 60 μm of the wide (conventional) horizontal and vertical scribe-lines 140, 130. For sake of completeness only, it is noted that the above graph is based on the assumption that the wafer is a 200 mm diameter wafer with an edge exclusion of about 3 mm and a conventional kerf width of about 60 μm.

Figure 4:
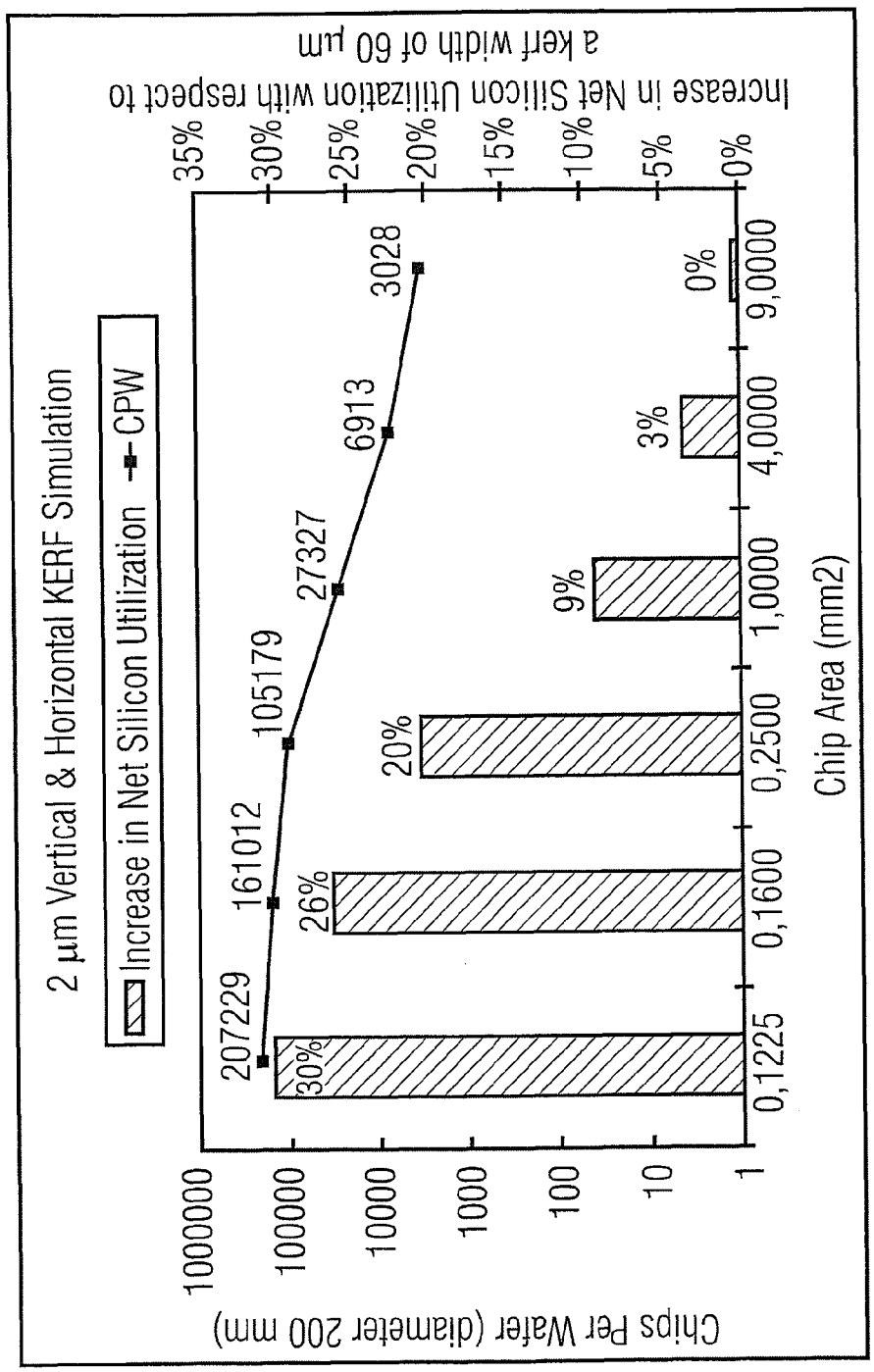
FIG. 4 displays an increase in net silicon utilization by using small scribe-lines.

FIG. 4 provides a graph showing, as a function of chip area, an increase in the number of chips per wafer by reducing the horizontal kerf width or horizontal scribe-line 140 and the vertical kerf width or vertical scribe-line 130 from a nominal (current) value of about 62 μm to the value of about 2 μm, according to embodiments of the present invention. The graphs in FIG. 4 show an approximate relationship between the reduction of the mentioned horizontal and vertical kerf width from about 62 μm to about 2 μm and furthermore an increase in net silicon utilization as a function of the chip area.

FIGS. 5a to 5e show steps of a process flow of dicing the wafer 110 in accordance with option A and with the chips 120a, 120b being arranged, for example, in the manner shown in FIG. 3. Before the process steps are outlined, the wafer 110 is described in more detail with respect to FIG. 5a.

Figure 5A:
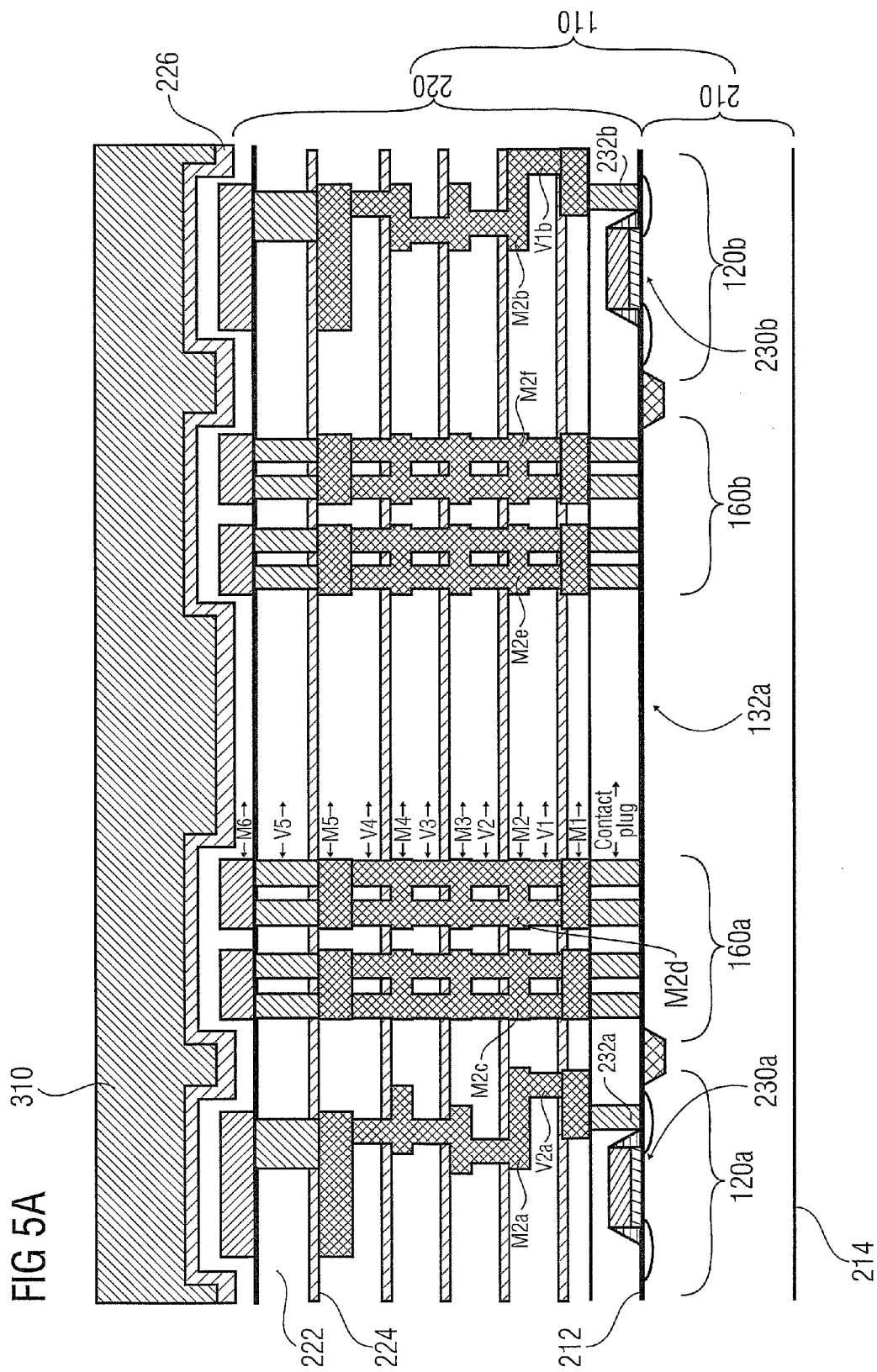

FIG. 5a shows a cross-section through the wafer 110, wherein the cross-section is done along the line of 5-5' in FIG. 3 over part of the first chip 120a and part of the second chip 120b. In FIG. 5a the first chip 120a is shown on the left-hand side and the part of the second chip 120b is shown on the right-hand side, wherein both chips are separated by the vertical kerf-line region 132a. The wafer 110 comprises a substrate 210 with a first surface 212 and a second surface 214, wherein a layer stack 220 is formed on the first surface 212. The layer stack 220 comprises an assembly of layers of alternating first material 222 and second material 224. The first material 222 comprises, for example, silicon oxide, and the second material 224 comprises, for example, a nitride. Along the layers of the second material 224 levels for metallizations are formed as metal layers M1, . . . , M6, which are separated by the first material 222. Each of the metal layers M1, . . . , M6 comprise different parts (plurality of components) formed at laterally different places along the layer stack 220. For example, a first part of the first metal layer M1a is formed at the first chip 120a and a second part of the first metal layer M1b is formed at the second chip 120b and so on. The metal layers M1, M2, . . . , M6 can moreover be connected by via-contacts V1, V2, . . . , V5. For example, the via-contact V2a connects the metal layers M2a with M3a (in the first chip 120a). The first metal layers M1 can be connected to the substrate 210 by contact plugs.

In the embodiments as shown in FIG. 5a, there are six layers with the first material 222 separated by five layers with the second material 224 and when viewed from the first surface 212, the last layer in the layer assembly 220 comprises an isolation layer 226. Of course, other number of layers 222 may be used as well, and the sequence of layers may be varied to the extent that more than two types of materials are arranged one upon the other. Accordingly, although in the following the number n of layers Mi 0<I<n is assumed to be six, other numbers may be used as well. The substrate 210 comprises a first device 230a arranged in the first chip 120a and a second device 230b arranged in the second chip 120b. The first and second device 230a and 230b can, for example, comprise a transistor with doped regions in the substrate 210 (comprising, for example silicon). The first device 230a can be connected to the metal layer M1a by a first contact plug 232a and second device 230b can be connected to the to the metal layer M1b by a second contact plug 232b. The metal layers M1a and M1b are in turn connected to the metal layers M2a, M3a, . . . , M6a and M1b, M2b, . . . , M6b by the via-contacts V1a, . . . , V5a and by V1b, . . . , V5b. The first chip 120a is sealed by a first seal ring 160a and the second chip 120b is sealed by a second seal ring 160b, wherein the first and second seal rings 160a and 160b each comprises two components of the metal layers M1, M2, . . . , M6, which are connected by two components of the via-contacts V1, V2, . . . , V5.

In more detail, the metal layers Mi=(M1, M2, M3, . . . , M6) comprise a plurality of components Mia, Mib, Mic, Mid, Mie and Mif (the index i=1, 2, . . . , 6 counts the different levels). The metal layers Mia are arranged at the first chip 120a, the metal layer Mib are arranged at the second chip 120b, the third and fourth metal layers Mic and Mid are arranged at the first seal ring 160a and the metal layer Mie and Mif are arranged at the second seal ring 160b. The metal layers Mi are connected by the via-contacts Vi, wherein again the component Via of the via-contacts Vi contact the metal layers Mia at the first chip 120a, the via-contacts Vib connect the metal layers Mib at the second chip 120b, the via-contacts Vic and Vid connect the metal layers Mic and Mid at the first seal ring 160a. The via-contacts Vie and Vif connect the metal layer Mie and Mif at the second seal ring 160b. In this way, the first surface 212 is connected with the last metal layers M6, which in turn is separated from the isolation layer 226 by a last part of the first material 222.

Possible materials for the metal layers M1, M2, . . . , M5 comprise aluminum or copper, the metal layers M6 can comprise aluminum, the via-contacts V1, V2, . . . , V6 can comprise aluminum or copper. The via-contact V5 and the contact plugs can comprise tungsten. These are exemplary materials and other embodiments comprise different materials. In addition, the numbers of layers as well as the number of metallizations differ in other embodiments.

In the situation depicted in FIG. 5a, the chips formed within the substrate 210, the stack 220 and isolation or passivation layer 226 may be completely processed in that these chips merely need to be diced and no further processing regarding the schematic of the circuitry of the chips is necessary. Some portions of the upper metal layer M6 may form or may be contacted with contact pads, the contact pads not being shown in FIG. 5a in order to ease the understanding of FIG. 5a and the subsequent figures. The contact pads allow for an external contact of the circuitry of the chips and are left uncovered by the isolation layer 226 which otherwise overlays all chip areas except the kerf-line regions.

After explaining the structure of the wafer, the steps of dicing are described next. In the first step of dicing the wafer 110, a KE resist layer 310 is deposited on the isolation layer 226, the KE resist layer 310 can, for example, comprise an organic material and is patterned by using a KE mask.

Figure 5B:
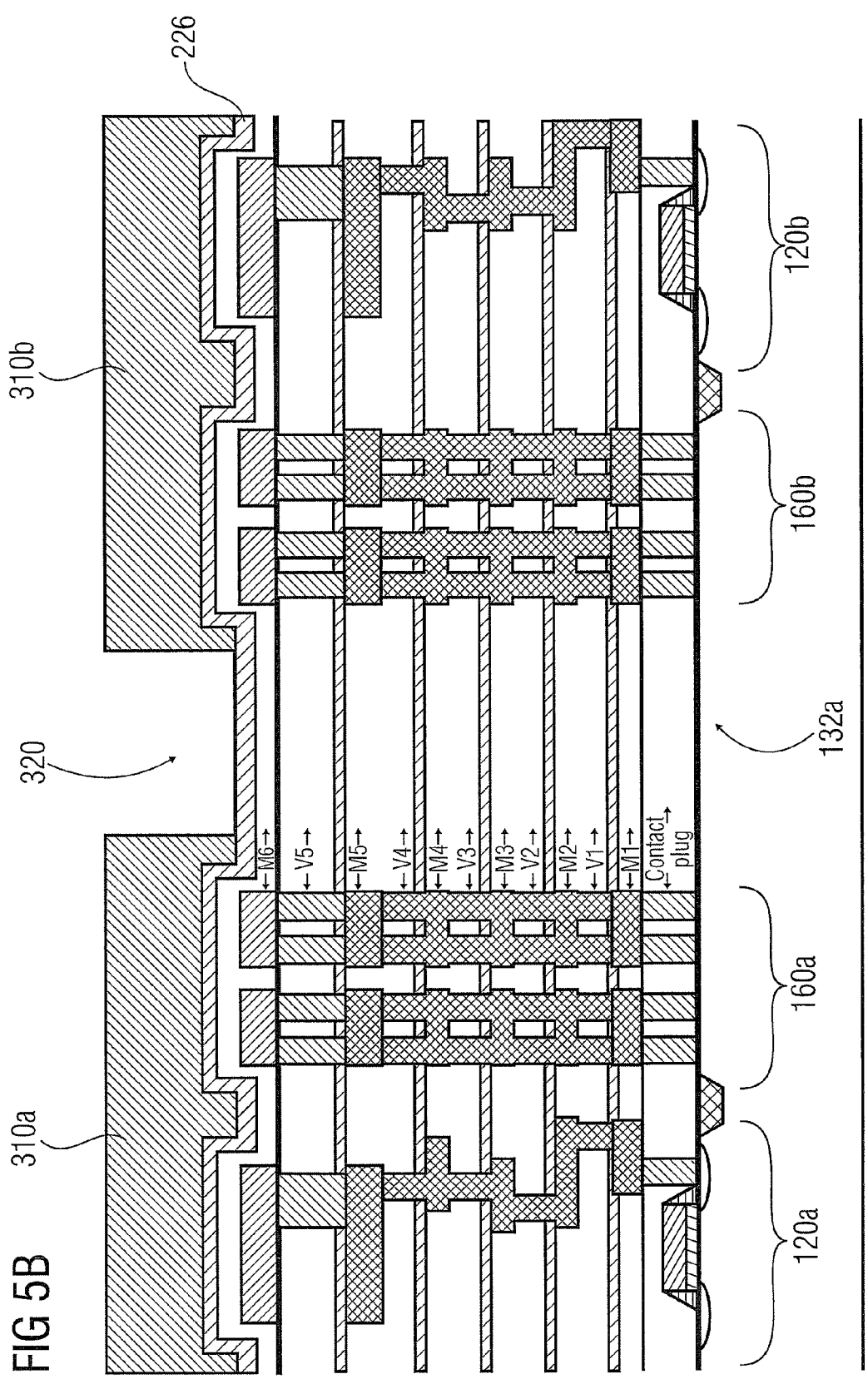

FIG. 5b shows a result of patterning of the KE resist layer 310 with a first part 310a and a second part 310b, which are separated by an opening 320 due to the patterning. The opening 320 is positioned along the vertical kerf-line 132a (which continues in the direction perpendicular to the drawing plane). The first part 310a of the KE resist layer is therefore formed on the first chip 120a with the first seal ring 160a, the second part of the KE resist layer 310b is formed on the second chip 120b with the second seal ring 160b, and along the opening 320, the isolation layer 226 is exposed. After the exposure of the isolation layer 226, a development can be performed to the first and second parts of the KE resist layers 310a, 310b. The patterning of the KE resist layer 310 can, for example, comprise an etching step.

FIG. 5c shows a subsequent step in which the isolation layer 226 and the layer stack 220 is removed along the vertical kerf-line region 132a. This step of removing can, for example, comprise an etching which stops on the substrate 210 and as a result, at the position of the first chip 120a with the first seal ring 160a and the position of the second chip 120b with the second seal ring 160b, the layer stack 220 is separated by the opening 320, so that the layer stack 220 separates into different parts, for each chip sealed by a sealing ring is one part of the layer stack 220. This step etches the exemplary oxide layer 222 and the exemplary nitride layer 224 in addition to the isolation layer 226, which can also comprise a nitride material. In this step, also a small amount of thickness of the substrate 210 can be removed, i.e., the etching does not stop exactly on the substrate 210. An example for such an etching is the oxide plasma dry etching.

FIG. 5d shows a following step in which a part 326 of the substrate 210 is removed so that the opening 320 extends inside the substrate 210. The step of removing the part 326 of the substrate 210 can, for example, comprise a dry plasma etch and can be done in an anisotropic way, that means the substrate 210 is opened only in the vertical direction towards the second surface 214. Alternatively, the step of removing the part 326 of the substrate 210 can also be performed after the KE resist layer 310 is removed from the isolation layer 226, the depth D of the part 326 of the substrate 210 depends on the desired thickness of the chip 120a, 120b (or a thinned substrate of the chip 120a, 120b) after the dicing procedure and can be adjusted, for example, by the length of the etching process.

Figure 5E:
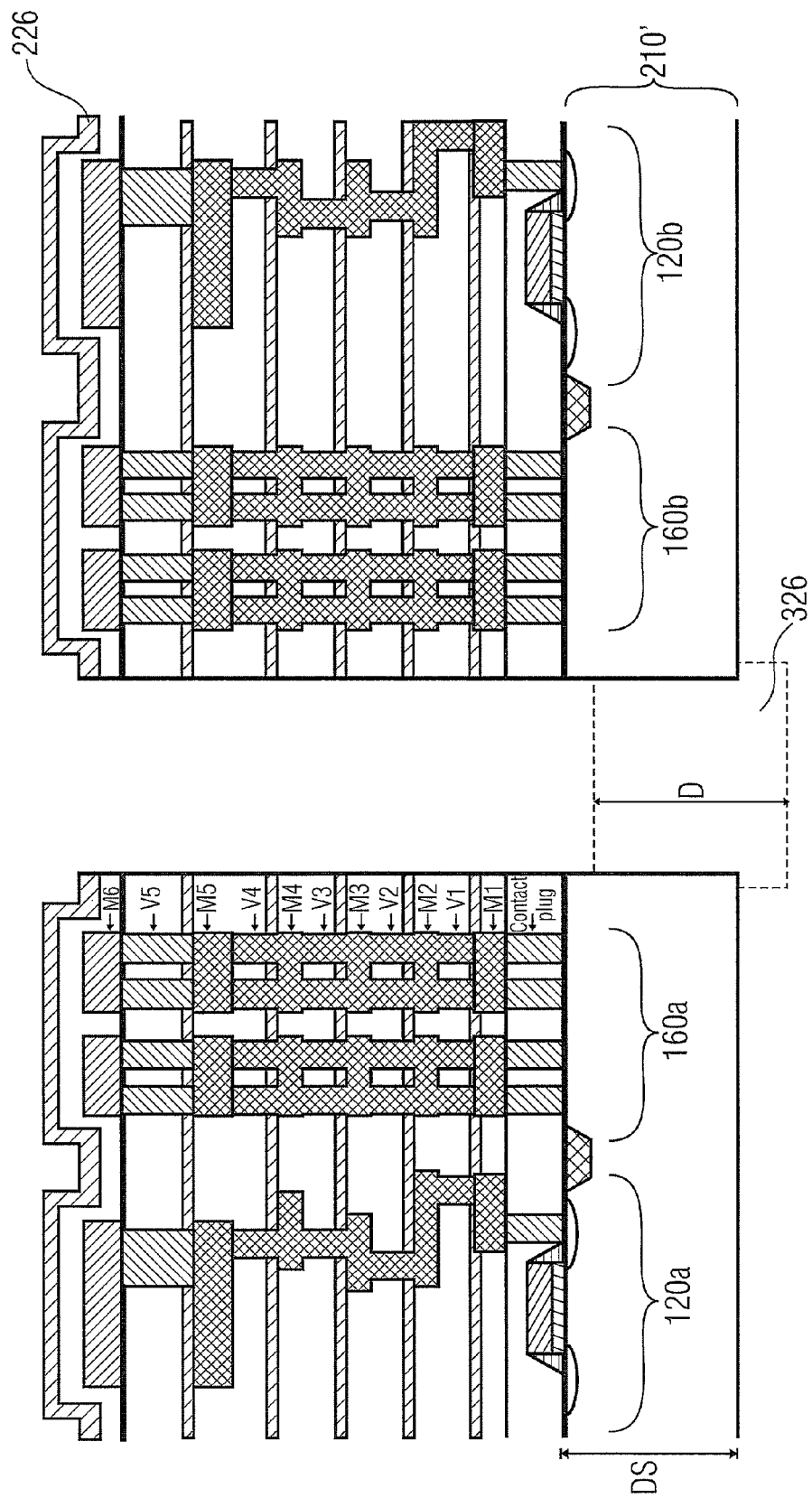

In FIG. 5e the KE resist layer 310 is removed from the isolation layer 226 and the substrate 210 is thinned from the second surface 214, so that the first chip 120a with the first seal ring 160a is separated from the second chip 120b with the second seal ring 160b. This means that the thickness DS of a thinned substrate 210' is smaller than the depth D of the part 326 of the substrate 210. Hence, the first chip 120a and the second chip 120b are no longer connected and separate from each other. Similarly, the remaining chips on the wafer 110 are disconnected so that all chips 120 singulate, which completes the dicing procedure. A backside grinding process can, for example, perform the thinning of the substrate 210.

FIGS. 6a to 6e show another process flow of dicing the wafer 110 according to the aforementioned option B.

Figure 6A:
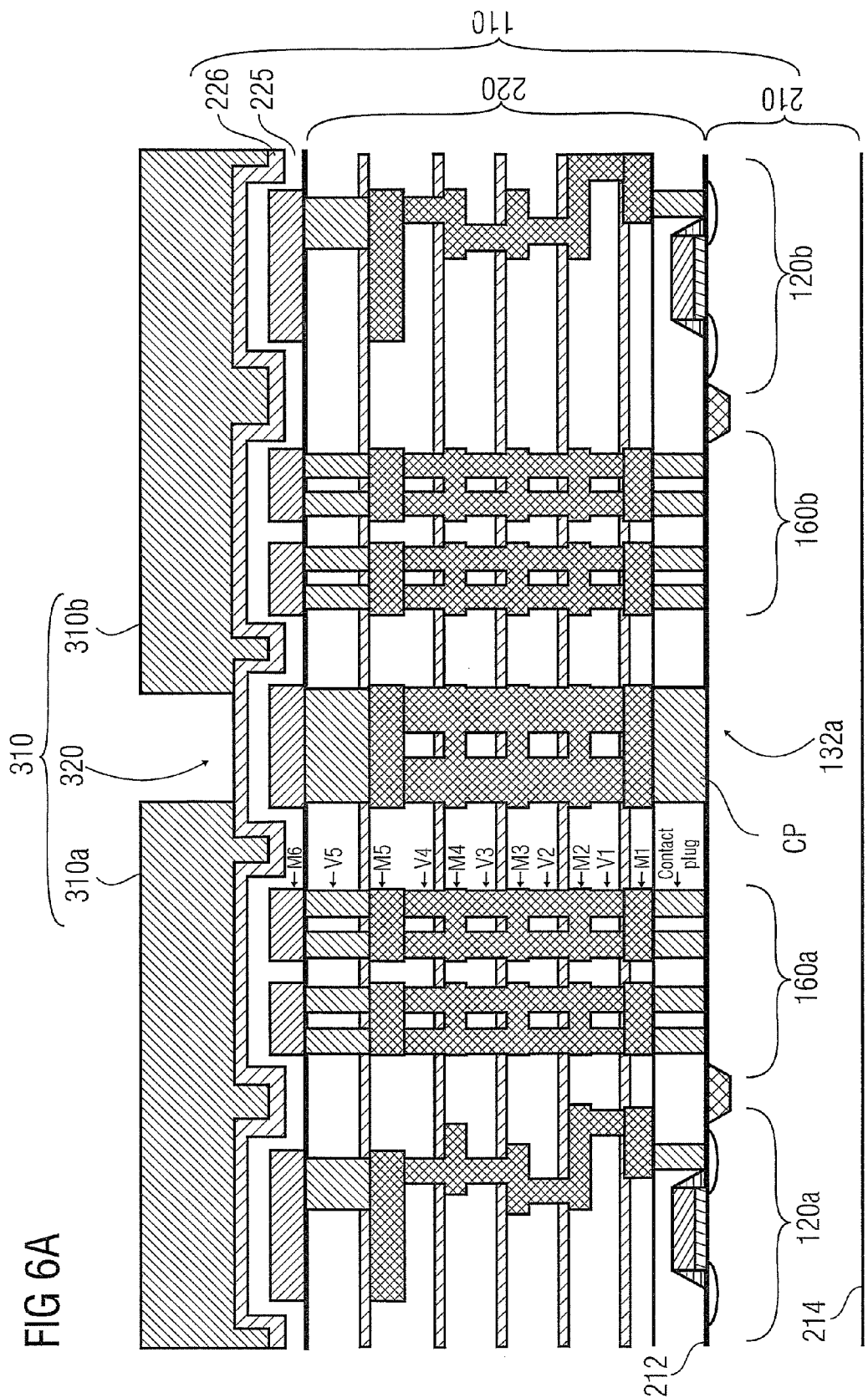

FIG. 6a shows a starting point of the wafer 110, which differs from the wafer 110 as shown in FIG. 5a in the way that along the vertical kerf-line region 132a, the layer stack 220 comprise conducting materials from the first surface 212 to the last metal layer level M6. Hence, the kerf line region 132a comprises a layer stack being formed, e.g., by a plurality of metal layers along the metal levels M1, M2, M3, . . . , M6, which in turn can be connected by via-contacts V1, V2, V 3, . . . , V5. On the last metal level M6, there are two isolation layers 225 and 226, which again protect the wafer 110. On the other side, a contact plug CP connects the first metal level M1 with the substrate 210.

A possible material of the sixth level M6 of metal layers is aluminum, the via-contacts V5 and the contact plug CP between the first metallic layer M1 and the substrate 210 can, for example, comprise tungsten and the material of the metal levels M1 to M5 as well as the via-contacts V1 to V4 can, for example, comprise aluminum or copper.

As in FIGS. 5a and 5b, in a first step there is a deposition of a KE resist layer 310, which is patterned in a way that there is an opening 320 along the vertical kerf-line region 132a separating the first chip 120a with the first seal ring 160a and the second chip 120b with the second seal ring 160b. The opening 320 again exposes the isolation layer 226 and optionally, the KE resist layer 310 is developed during this step of dicing the wafer 110.

Figure 6B:
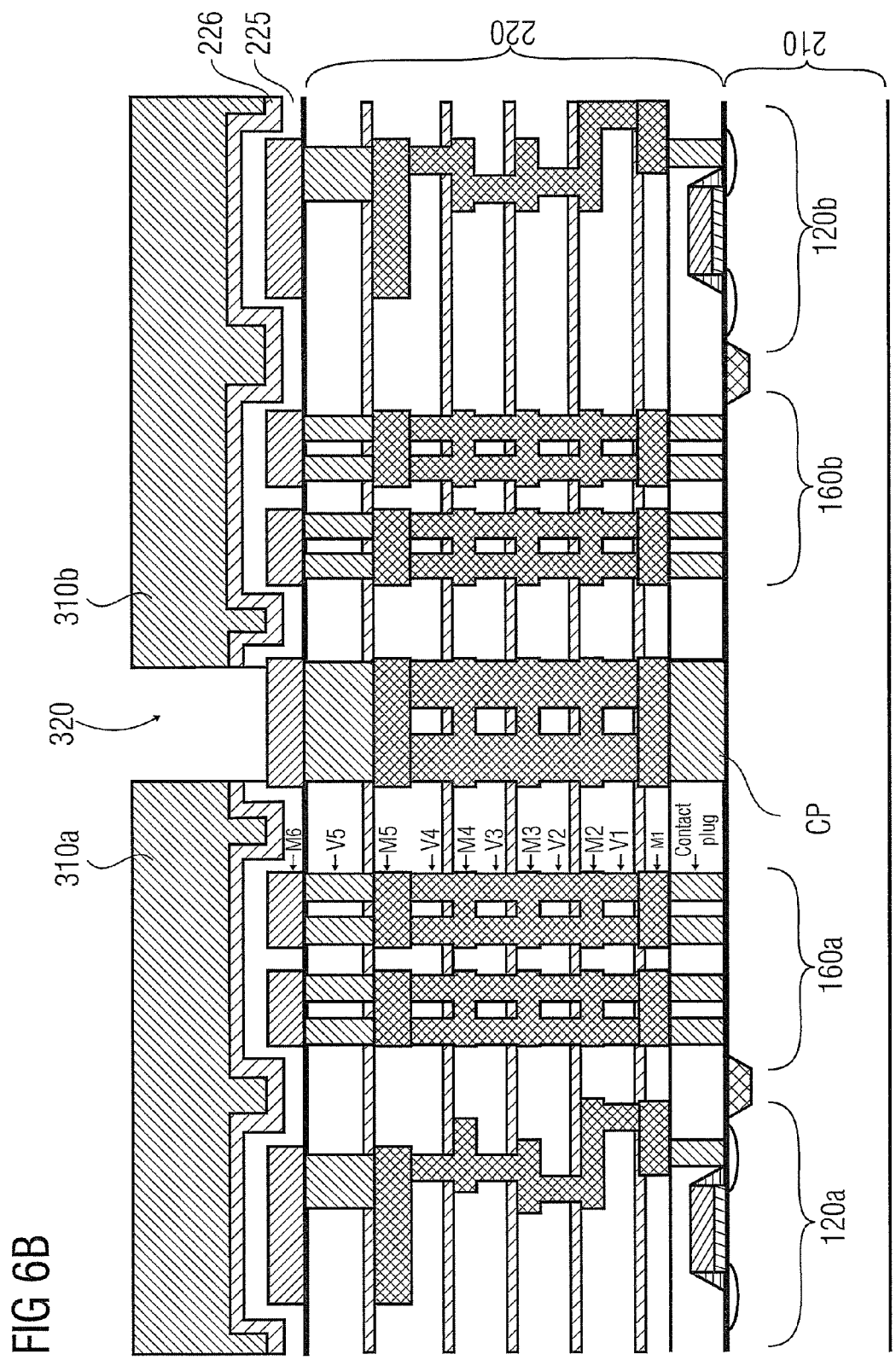

In FIG. 6b a step of selective etching is performed in order to remove the isolation layer 226 and the further isolation layer 225 which comprise, for example, a silicon oxide and a nitrite. As a consequence, the sixth level of metal layers M6 is exposed along the opening 320.

After the KE etch of the top oxinitrite layer, FIG. 6c shows an etch step in which the conducting material along the layer stack 220 is removed from the opening 320 to the first surface 212 of the substrate 210. Therefore, along the vertical kerf-line region 132a, the layer stack 220 of the first chip 120a with the first seal ring 160a is separated from the layer stack 220 of the second chip 120b with the second seal ring 160b. This step of removing the conducting materials along the vertical kerf-line region 132a can, for example, comprise an etching step, which selectively etches the metallic layers M6 to M1, the via-contacts V1 to V5 and the contact plug CP and stops, e.g., on the substrate 210. During this etching step, the substrate 210 can also be etched to a certain degree (not shown in this figure) so that also part of the substrate 210 is removed during this step.

The step of removing the conducting materials can, for example, comprise the KE kerf etch, wet etch, which is based, for example, on a chemical solution called Piranha which selectively removes organic photoresists as well as metallics. Naturally, other chemical solutions may be applicable as well. At the time when the conducting material inside the opening 320 along the vertical kerf-line region 132a is removed, the KE resist layer 310 (or their parts 310a, 310b etc) can also be removed. This is possible by appropriately choosing the chemical solution.

Figure 6D:
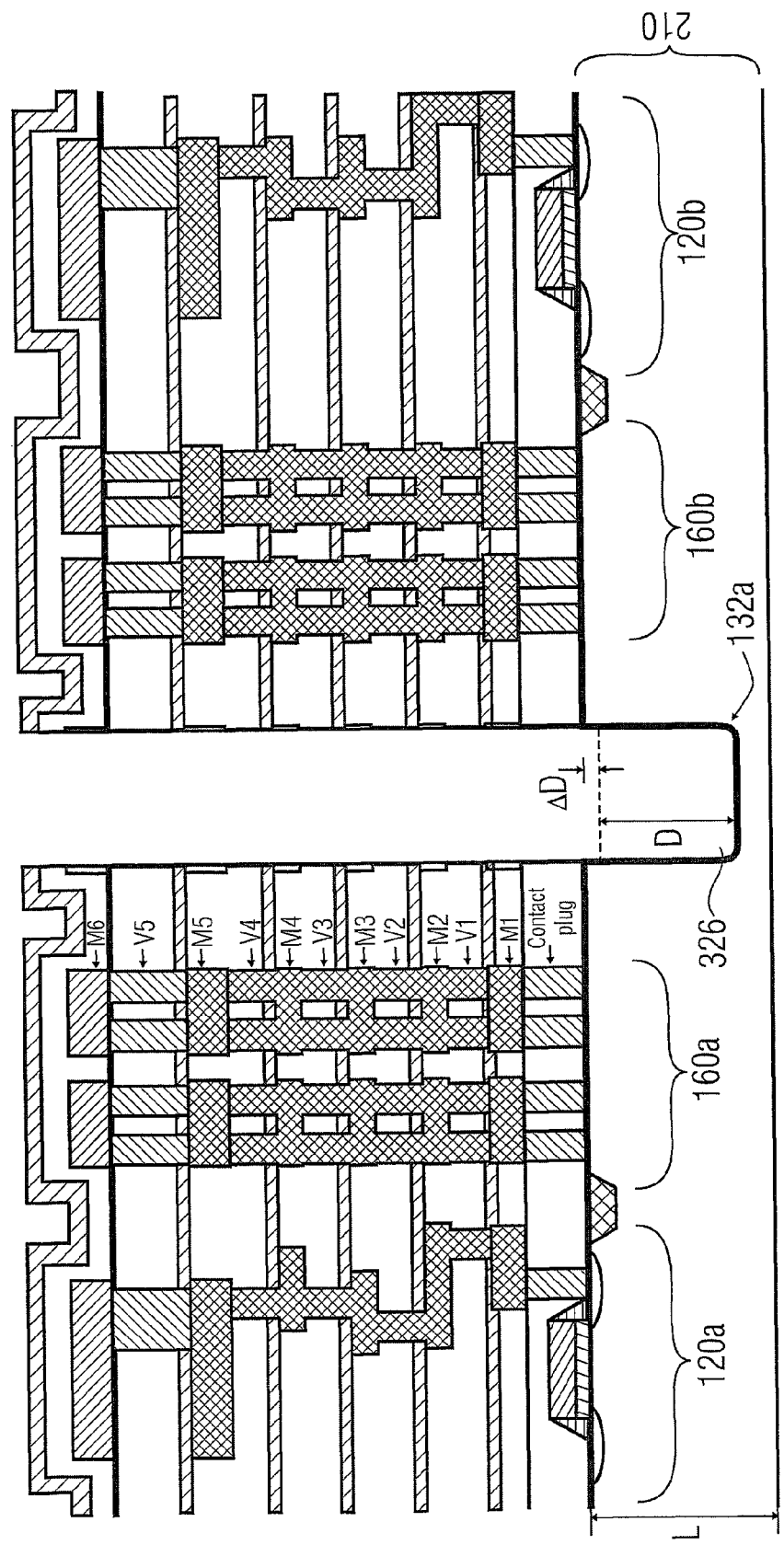

FIG. 6d shows a step, in which a part 326 of the substrate 210 is removed, for example to a depth D, which is, for example, smaller than the thickness L of the substrate 210. FIG. 6d also shows that during the etching step, which removes the metallic layers inside the layer stack 220, also a small amount of thickness ΔD of the substrate 210 is removed. This step can, as in the process step as described in FIG. 5d, comprise an anisotropic etching which removes substrate material only along the vertical kerf-line region 132a, and can comprise a plasma etching step.

FIG. 6e shows the result of an ensuing thinning process of the wafer 210 from the second surface 214, so that the substrate comprises a thickness DS which is, in general, smaller than the depth D of the part 326 of the substrate 210 removed in the previous step. As a result, the first chip 120a with the first sealing ring 160a is separated from the second chip 120b with the second sealing ring 160b. In the same way, the other chips 120 are also separated so that the wafer 120 singulates into a plurality of chips. As in option A, this thinning process of the substrate 210 can, for example, comprise a backside grinding process.

In summary, FIGS. 5a to 5e show the schematic of the process steps of option A and FIGS. 6a to 6e the process flow of option B, wherein a lithographic mask KE 310 is adopted. The KE mask 310 is designed, for example, to accommodate only about 2 μm wide slit that runs around (four) sides of the die without interruption.

FIG. 7 shows the first chip 120a comprising a first KE mask layer 310a, the second chip 120b comprising a second KE mask layer 310b, and the third chip 120c comprising a third KE mask layer 310c. The first and second chips 120a and 120b are sealed by seal rings 160 and separated by kerf-line regions 132, 142 (in this figure the kerf-line regions can be either horizontal or vertical) of a width KW2. As a result of the process steps as described in FIGS. 5a to 5e or FIGS. 6a to 6e, the first layer stack 220a of the first chip 120a, the second layer stack 220b of the second chip 120b and the third layer stack 220c of the third chip 120c are separated by the etching processes and in addition, the substrate 210 is cut to a depth D along the kerf-line regions 132, 142. In the embodiment as shown in FIG. 7, the thinning of the substrate 210 is performed for as long a period until the chips 120a-120c singulates. Hence, if the substrate 210 comprises an original thickness L, the thinning is done until the thinned substrate 210' comprises a thickness of at most D, being the depth of the removing of part 326 of the substrate 210 during the etching process as described before.

The original thickness L of the substrate 210 can, for example, comprise a value of approximately 700 μm and the depth d can, for example, be in the region between about 10 and about 100 μm, or between the region of about 20 to about 50 μm. Therefore, in this embodiment, the grinding process or the thinning process of the wafer 210 separates each chip 120 for very thin chips 120, where the thinned substrate 210' comprises only a thickness, which equals approximately the depth D.

FIG. 8 shows as another embodiment comprising a cutting (e.g., a backside laser cut) to separate each chip 120. This is especially advantageous, if the substrate 210 comprises a thickness exceeding the depth D. For example, if the thinned substrate 210' shall have a thickness L1 of approximately 180 μm or more about 100 μm, so that it is technologically difficult to remove the part 326 of the substrate 210 to a depth D of this high value L. Hence, a different approach is chosen. In a first step, the substrate 210 is thinned from the original value L to a target value L1 yielding a thinned substrate 210' with a second surface 214'. In this step the chips 120 are not yet separated and, therefore, a second step is needed, where the thinned substrate 210' is perforated from the second surface 214' by a cut along the kerf line regions 132, 142.

For example, using this procedure a backside laser beam cut can separate the chips 120 and this laser beam cut can be performed along the kerf-line regions 132, 142 and comprises a width W. As mentioned, the laser beam cut is performed from the second surface 214' of the thinned substrate 210' until the laser beam perforates the thinned substrate 210' along the kerf-line regions 132, 142 to get an open connection to the removed part 326. Hence, the cut is performed at least to a depth being the difference between the thickness L1 and the depth D.

The laser beam or the laser saw, can, for example, comprise a width W within a range of about 5 μm to about 50 μm or between about 10 μm to about 20 μm, and the original wafer thickness L in this embodiment can be of approximately 700 μm. This embodiment is especially advantageous if the thinned substrate 210' should comprise a certain minimum thickness L1, which is larger than the depth D, and which in turn is technologically difficult to achieve by the aforementioned (etching) methods.

What is claimed is:

1. A method of dicing a semiconductor wafer, the method comprising:
    providing the semiconductor wafer so that the semiconductor wafer comprises
        a substrate with a main surface,
        a layer stack disposed on the main surface, the layer stack comprising at least one interconnection layer embedded into insulating material, and
        a plurality of circuits laterally distributed within the wafer, the circuits being separated from each other by kerf-line regions, the layer stack comprising interconnecting vias made of a conductive material within the kerf-line regions so that the conductive material is formed as a continuous physical path-connected closed loop within a layer of the layer stack around each of the plurality of circuits as well as continuously along a wafer normal direction from a surface of the layer stack facing away from the substrate, through the layer stack to the main surface of the substrate;
    singularizing the layer stack along the kerf-line regions, the singularizing comprising
        etching away, by wet etching, the conductive material within the kerf-line regions en-block with the substrate acting as an etch stop so that, after wet etching, the layer stack is singularized along the kerf-line regions, and
        dry etching, after the wet etching, at least part of the substrate within the kerf-line regions from the main surface of the substrate to form grooves in the main surface of the substrate extending along the kerf-line regions; and
    singularizing the plurality of circuits by separating the substrate along the grooves.

2. The method of claim 1, further comprising sawing the substrate from a side opposite to the main surface and laterally aligned to the kerf-line regions.

3. The method of claim 1, wherein the wet etching uses hydrogen peroxide, sulfuric acid and/or water.

4. The method of claim 1, wherein the dry etch is an oxide plasma etch.

5. The method of claim 1, wherein the wafer comprises a passivation layer, the method further comprising a step of etching the passivation layer by using a resist layer, and
    wherein the step of wet etching is performed such that the resist layer is removed.

6. The method of claim 1, wherein the wafer further comprises a control structure for testing and monitoring a processing of the plurality of circuits, the control structure disposed on a separate region of the wafer that is different from the kerf-line regions.

7. The method of claim 6, wherein the control structure comprises at least one of a process control monitor structure, a photolithographic alignment structure, a wafer level reliability test circuit, a film thickness and/or a critical dimension measurement structure.

8. The method of claim 6, wherein the circuits are organized as chips, each chip being surrounded by a portion of the kerf-line regions, and wherein the control structure occupies at least a portion of a contiguous region, the contiguous region comprising a footprint larger than a footprint of each of the chips, the chips being arranged on the wafer outside the contiguous region.

9. The method of claim 1, wherein the kerf-line regions comprise at least one horizontal kerf-line region and at least one vertical kerf-line region.

10. The method of claim 1, wherein at least one kerf-line region comprises a width of less than 5 μm.

11. The method of claim 1, wherein the conductive material comprises a metallic material.

12. The method of claim 1, wherein the layer stack comprises metal layers that comprise aluminum, tungsten and/or copper.

13. The method of claim 1, wherein the wafer further comprises contact pads, the contact pads being configured to allow for an external contact of the plurality of circuits and being electrically connected to an electrical device integrated into a semiconductor substrate by via connections.

14. The method of claim 13, wherein the wafer further comprises an exposed passivation layer completely covering the plurality of circuits except the contact pads.

15. A method for producing chips, the method comprising:
    fabricating a plurality of chips on a wafer, fabricating comprising
        providing a semiconductor substrate comprising a main surface,
        forming electrical devices at the main surface, and
        depositing and structuring a layer stack on the main surface, the layer stack comprising conductive interconnection layers embedded into insulating material, and interconnected to each other, and connected to the electrical devices and external contacts for surface mounting or wire bonding the chips via vias, wherein the conductive interconnection layers and the vias are made of conductive material and the depositing and structuring takes place such that the conductive material is formed as a continuous physical path-connected closed loop within a layer of the layer stack around each of the plurality of chips as well as continuously along a wafer normal direction from a surface of the layer stack facing away from the substrate, through the layer stack to the main surface of the substrate, thereby forming kerf-line regions which extend along the closed loops; and
    dicing the chips on the wafer along kerf-line regions after the step of fabricating, the step of dicing comprising
        etching the conductive material within the kerf-line regions away en-block with the substrate acting as an etch stop so that the layer stack is singularized along the kerf-line regions, and then
        dry etching at least part of the substrate within the kerf-line regions from the main surface so as to form a groove in a form of a closed loop around each chip, and then
        singularizing groups of the electrical devices that are laterally distributed within the wafer and separated from each other by the kerf-line regions by separating the substrate along the grooves.

16. The method of claim 15, wherein the etching the conductive material comprises wet etching.

17. The method of claim 15, wherein the conductive interconnection layer comprises a metal layer.

18. The method of claim 15, wherein the main surface comprises a planar surface facing the conductive interconnection layers, the planar surface comprising a planarity that is constant across the kerf line regions and portions of a plurality of circuits adjacent to the kerf line regions.

* * * * *